(12) United States Patent
Takeuchi et al.

(10) Patent No.: US 10,439,037 B2
(45) Date of Patent: Oct. 8, 2019

(54) METHOD FOR MANUFACTURING COMPOUND SEMICONDUCTOR DEVICE INCLUDING P-TYPE IMPURITY LAYER

(71) Applicant: DENSO CORPORATION, Kariya, Aichi-pref. (JP)

(72) Inventors: Yuichi Takeuchi, Kariya (JP); Katsumi Suzuki, Nagakute (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/069,622

(22) PCT Filed: Jan. 19, 2017

(86) PCT No.: PCT/JP2017/001771
§ 371 (c)(1),
(2) Date: Jul. 12, 2018

(87) PCT Pub. No.: WO2017/145593
PCT Pub. Date: Aug. 31, 2017

(65) Prior Publication Data
US 2019/0013392 A1  Jan. 10, 2019

(30) Foreign Application Priority Data

Feb. 23, 2016 (JP) .................................. 2016-032290

(51) Int. Cl.
*H01G 4/38* (2006.01)
*H01L 29/66* (2006.01)
(Continued)

(52) U.S. Cl.
CPC .... *H01L 29/66068* (2013.01); *H01L 21/0262* (2013.01); *H01L 21/02378* (2013.01);
(Continued)

(58) Field of Classification Search
CPC .................... H01L 29/66068; H01L 21/02378
(Continued)

(56) References Cited

U.S. PATENT DOCUMENTS 4,862,230 A   8/1989  Uji
5,693,139 A *  12/1997  Nishizawa ............ C23C 16/455
117/89

(Continued)

FOREIGN PATENT DOCUMENTS

| JP | 09-36426 A    | 2/1997 |
| JP | 2001-077027 A | 3/2001 |
| JP | 2008-205203 A | 9/2008 |

*Primary Examiner* — Jami Valentine Miller
(74) *Attorney, Agent, or Firm* — Posz Law Group, PLC

(57) ABSTRACT

A method for manufacturing a compound semiconductor device includes causing epitaxial growth of a p-type impurity layer containing a compound semiconductor on a foundation layer containing the compound semiconductor. The causing the epitaxial growth includes performing pre-doping to preliminarily introduce dopant gas before introducing material gas for the epitaxial growth of the compound semiconductor. The dopant gas contains an organic metal material providing dopant of p-type impurities. An impurity concentration profile of the p-type impurity layer is controlled by controlling a time of the pre-doping.

4 Claims, 6 Drawing Sheets

(51) Int. Cl.
*H01L 21/02* (2006.01)
*H01L 29/16* (2006.01)
*H01L 29/78* (2006.01)

(52) U.S. Cl.
CPC .... *H01L 21/02529* (2013.01); *H01L 29/1608* (2013.01); *H01L 29/7813* (2013.01)

(58) Field of Classification Search
USPC .......................................................... 438/270
See application file for complete search history.

(56) References Cited

U.S. PATENT DOCUMENTS

| | | | | |
|---|---|---|---|---|
| 5,708,301 | A * | 1/1998 | Iyechika | H01L 33/40 257/744 |
| 6,479,313 | B1 * | 11/2002 | Ye | H01L 21/2683 257/E21.326 |
| 7,365,369 | B2 * | 4/2008 | Nakamura | H01L 33/32 257/13 |
| 7,556,977 | B2 * | 7/2009 | Yamamoto | B82Y 20/00 117/104 |
| 2006/0175601 | A1 * | 8/2006 | Lieber | B82Y 10/00 257/19 |
| 2016/0104794 | A1 | 4/2016 | Takeuchi et al. | |

* cited by examiner

METHOD FOR MANUFACTURING COMPOUND SEMICONDUCTOR DEVICE INCLUDING P-TYPE IMPURITY LAYER

CROSS REFERENCE TO RELATED APPLICATIONS

This application is a U.S. national phase of International Application No. PCT/JP2017/001771 filed on Jan. 19, 2017, and is based on Japanese Patent Application No. 2016-32290 filed on Feb. 23, 2016, the disclosure of which is incorporated herein by reference.

TECHNICAL FIELD

The present disclosure relates to a method for manufacturing a compound semiconductor device that includes a compound semiconductor such as silicon carbide (hereinafter referred to as SiC) and gallium nitride (hereinafter referred to as GaN).

BACKGROUND ART

Various types of compound semiconductor devices, each including a compound semiconductor such as SiC and GaN, have been proposed. Among these compound semiconductor devices, there is a type provided with a vertical switching element such as a vertical metal-oxide-semiconductor field-effect transistor (MOSFET) that has an inverted type trench gate structure.

The vertical MOSFET having an inverted type trench gate structure causes such an action that applies a gate voltage to a gate electrode inside a trench to form a channel in a p-type base area located on a trench side face, and produces an electrical current flowing between a drain and a source via the channel thus formed. According to this type of vertical MOSFET, on-resistance and element breakdown voltage are largely dependent on an impurity concentration of the p-type base area. More specifically, channel mobility increases as the impurity concentration of the p-type base area decreases. In this case, channel resistance lowers, wherefore reduction of on-resistance is achievable. However, a breakdown voltage between the drain and the source drops by a punch-through phenomenon caused in this state. As a result, the element breakdown voltage drops. Accordingly, achievement of both high channel mobility and a sufficient element breakdown voltage is essentially difficult.

To address this, control is required in such a manner as to change the impurity concentration of the p-type base area, which includes the channel, as sharply as possible, for example. More specifically, the p-type base area is formed on an n⁻-type drift layer through epitaxial growth. When the impurity concentration of the p-type base area slowly increases, a thickness of the p-type base area sufficient for obtaining desired characteristics, i.e., a channel length, increases. Accordingly, it is required to change the impurity concentration of the p-type base area as sharply as possible.

Examples of a method for sharply changing an impurity concentration of an impurity layer as described above include a method for sharply changing an impurity concentration of an n-type impurity layer as disclosed in Patent Literature 1. According to this method, propane ($C_3H_8$) and silane ($SiH_4$) constituting a material gas for SiC are introduced to develop an undoped layer. In an intermediate period of the introduction, the introduction quantity of propane starts to be reduced, while nitrogen ($N_2$) constituting n-type dopant starts to be introduced. In this manner, the introduction quantity of propane constituting the material gas is reduced during introduction of n-type dopant to change a C/Si ratio. Accordingly, a change of the impurity concentration of the n-type impurity layer is achievable.

PRIOR ART LITERATURE

Patent Literature

Patent literature 1: JP 2001-77027 A

SUMMARY OF INVENTION

The present inventors have carried out extensive studies, and have confirmed that the method disclosed in Patent Literature 1 as described above is adoptable for a sharp change of a concentration of an n-type impurity layer, but unable to achieve a sharp change of a concentration of a p-type impurity layer.

More specifically, for forming a p-type impurity layer, TMA (the abbreviation of trimethylaluminum) constituting an organic metal material is employed as p-type dopant, for example. In this case, as confirmed by the present inventors, a rise delay that is peculiar to organic metal materials is produced, which prevents a sharp change of the concentration of the p-type impurity layer. The impurity concentration of the p-type base area is therefore difficult to change sharply. Accordingly, the channel length increases, and may cause increase of on-resistance.

This fact arising from the SiC semiconductor device presented by way of example is applicable to other types of compound semiconductor devices such as a GaN semiconductor device. In addition, while achievement of a sharp change of the impurity concentration of the p-type impurity layer is described herein, this change is not required to be a sharp change. Other types of changes may be produced as long as desired adjustment is achievable in accordance with a target impurity concentration profile with excellent controllability.

It is an object of the present disclosure to provide a method for manufacturing a compound semiconductor device capable of controlling an impurity concentration profile of a p-type impurity layer with excellent controllability.

According to an aspect of the present disclosure, a method for manufacturing a compound semiconductor device includes causing epitaxial growth of a p-type impurity layer containing a compound semiconductor on a foundation layer containing the compound semiconductor. The causing the epitaxial growth includes performing pre-doping to preliminarily introduce dopant gas before introducing material gas for the epitaxial growth of the compound semiconductor. The dopant gas contains an organic metal material providing dopant of p-type impurities. An impurity concentration profile of the p-type impurity layer is controlled by controlling a time of the pre-doping.

In this case, the pre-doping achieves absorption of the dopant to an inner wall surface of a chamber or other positions beforehand, and reduces absorption of the dopant during epitaxial growth. In addition, the absorption quantity to the chamber is controllable by controlling the time of the pre-doping. In this case, the impurity concentration profile of the p-type impurity layer is controllable. Accordingly, a p-type dopant concentration in an atmosphere inside the chamber, for example, is maintained at a desired concentration from an initial stage of epitaxial growth. In this condition, a sharp change of the impurity concentration of the p-type impurity layer is achievable.

DESCRIPTION OF EMBODIMENTS

Embodiments according to the present disclosure are hereinafter described with reference to the drawings. In the respective embodiments described herein, identical or equivalent parts are given identical reference numbers.

First Embodiment

A first embodiment is now described. A compound semiconductor device described by way of example herein is an SiC semiconductor device that includes a vertical MOSFET having an inverted type trench gate structure.

Figure 1:
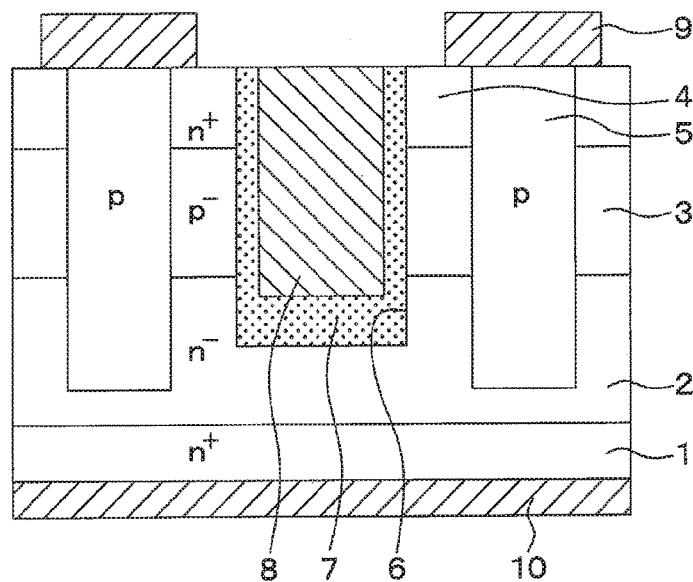
FIG. 1 is a diagram illustrating a cross-sectional configuration of an SiC semiconductor device according to a first embodiment.

An SiC semiconductor device illustrated in FIG. 1 includes a vertical MOSFET having a trench gate structure and disposed in a cell area. The SiC semiconductor device has an outer peripheral resistant structure (not shown) disposed in an outer peripheral area surrounding the cell area.

The SiC semiconductor device has a semiconductor substrate that includes an $n^+$-type substrate 1 constituting a high-concentration impurity layer composed of SiC, and an $n^-$-type drift layer 2 disposed on a front face side of the $n^+$-type substrate 1 and composed of SiC having an impurity concentration lower than the impurity concentration of the $n^+$-type substrate 1. The $n^+$-type substrate 1 has an n-type impurity concentration of $1.0\times10^{19}/cm^3$, for example, while the $n^-$-type drift layer 2 has an n-type impurity concentration ranging from $0.5\times10^{16}/cm^3$ to $2.0\times10^{16}/cm^3$, for example.

A base area 3 is formed in an upper layer part of the $n^-$-type drift layer 2. According to the present embodiment, the base area 3 contains p-type SiC having an impurity concentration higher than the impurity concentration of the $n^-$-type drift layer 2. The base area 3 is configured to have such an impurity concentration that sharply changes from a boundary position between the base area 3 and the $n^-$-type drift layer 2.

Figure 2:
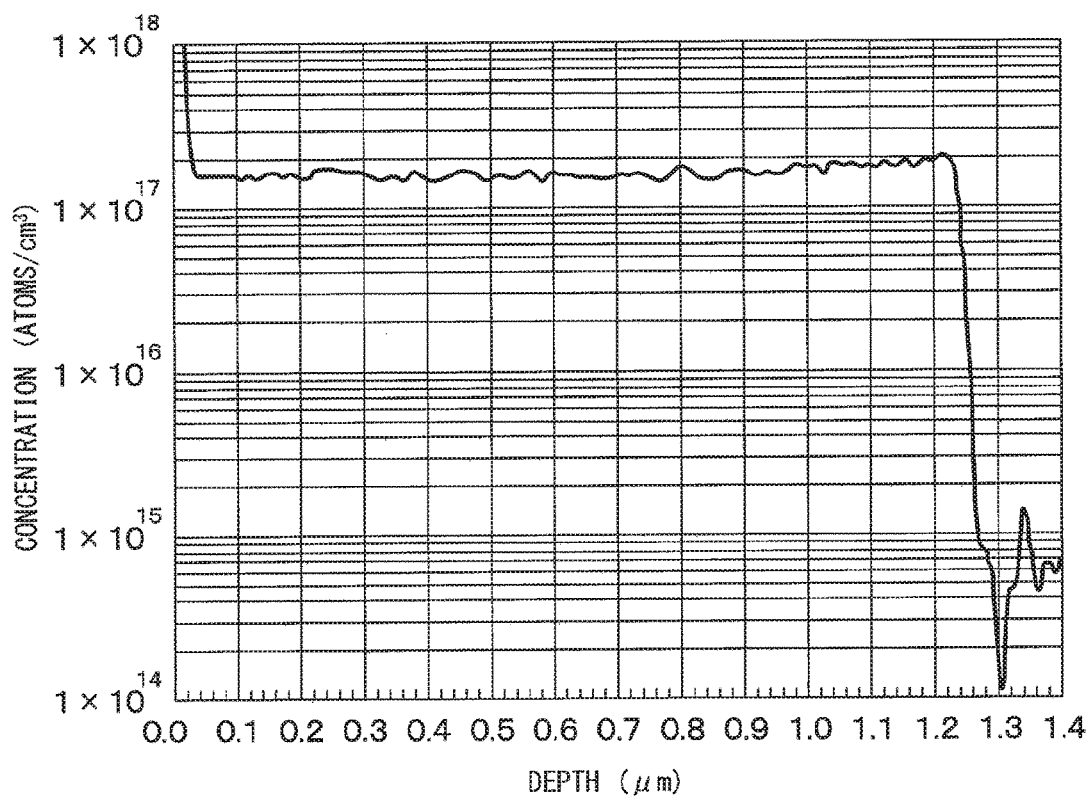
FIG. 2 is a graph showing a p-type impurity concentration profile inside a base area.

For example, the base area 3 according to the present embodiment has a p-type impurity concentration of approximately $2.0\times10^{17}/cm^3$, and a thickness of 300 nm. For example, the base area 3 is configured to have a concentration profile of Al (aluminum) constituting p-type impurities as shown in FIG. 2. More specifically, as shown in FIG. 2, the base area 3 is configured to have a p-type impurity concentration of approximately $2.0\times10^{17}/cm^3$ from a front face of the base area 3 up to a depth of approximately 1.3 μm (micrometers), for example. A dope quantity of p-type impurities decreases in a pulsed manner in a portion located at a depth approximately in a range from 1.2 μm to 1.3 μm from the front face of the base area 3. This portion corresponds to the boundary position between the base area 3 and the $n^-$-type drift layer 2, where the impurity concentration of the base area 3 changes sharply.

An $n^+$-type source area 4 is further formed in an upper layer part of the base area 3. A p-type deep layer 5 extends from a front face of the $n^+$-type source area 4, penetrates the $n^+$-type source area 4 and the base area 3, and reaches the $n^-$-type drift layer 2. The $n^+$-type source area 4 is disposed on each side of a trench gate structure to be described below. The $n^+$-type source area 4 is between the trench gate structure and the p-type deep layer 5 disposed on a side opposite to the trench gate structure. The p-type deep layer 5 reaches a position deeper than the trench gate structure. A front layer part of the $n^+$-type source area 4 is configured to have an n-type impurity concentration of approximately in a range from $2.5\times10^{18}/cm^3$ to $1.0\times10^{19}/cm^3$, and a thickness of approximately 0.5 μm, for example. The p-type deep layer 5 has an impurity concentration higher than the impurity concentration of the base area 3, and has a p-type impurity concentration in a range from $1.0\times10^{17}/cm^3$ to $1.0\times10^{19}/cm^3$, for example. According to the present embodiment, the p-type deep layer 5 also functions as a contact area for contacting a source electrode 9 to be described below.

A trench 6 that has a longitudinal direction coinciding with a vertical direction of the figure penetrates the base area 3 and the $n^+$-type source area 4, and reaches the $n^-$-type drift layer 2. The base area 3 and the $n^+$-type source area 4 described above are disposed to be in contact with a side face of the trench 6.

A portion of the base area 3 located on the side face of the trench 6 constitutes a channel area that connects the $n^+$-type source area 4 and the $n^-$-type drift layer 2 during operation of the vertical MOSFET. A gate insulation film 7 is formed on an inner wall surface of the trench 6 including the channel area. A gate electrode 8 containing doped Poly-Si is formed on a front face of the gate insulation film 7. The inside of the trench 6 is filled with the gate insulation film 7 and the gate electrode 8.

The trench gate structure is configured as described above. The trench gate structure extends in a longitudinal direction coinciding with the vertical direction of FIG. 1. A plurality of the trench gate structures are arranged in the left-right direction of FIG. 1 to constitute a stripe form. Similarly, the $n^+$-type source area 4 and the p-type deep layer 5 described above constitute a layout structure extending in the longitudinal direction of the trench gate structure.

The source electrode 9 and gate wiring (not shown) are further formed on the front faces of the $n^+$-type source area 4, the p-type deep layer 5, and a front face of the gate electrode 8. Each of the source electrode 9 and the gate wiring contains a plurality of types of metal, such as Ni/Al. At least a part of the plurality of types of metal being in contact with n-type SiC, more specifically, in contact with the $n^+$-type source area 4 contains metal capable of achieving ohmic contact with n-type SiC. At least a part of the plurality of types of metal being in contact with p-type SiC, more specifically, in contact with the p-type deep layer 5 is constituted by metal capable of achieving ohmic contact with p-type SiC. Each of the source electrode 9 and the gate wiring is provided on an interlayer insulation film (not shown) for electric insulation. Electric contacts between the source electrode 9 and each of the n$^+$-type source area 4 and the p-type deep layer 5, and between the gate wiring and the gate electrode 8 are achieved via contact holes formed in the interlayer insulation films.

A drain electrode 10 electrically connected to the n$^+$-type substrate 1 is further formed on a rear face side of the n$^+$-type substrate 1. The vertical MOSFET having the n-channel type and inverted type trench gate structure is constructed as above. An outer peripheral resistant structure (not shown) is disposed in the outer peripheral area of the cell area where the vertical MOSFET is formed to constitute the SiC semiconductor device of the present embodiment.

According to the vertical MOSFET included in the SiC semiconductor device and having the inverted type trench gate structure configured as above, a channel area is formed in a front face of the base area 3 at a portion being in contact with the trench 6 when a gate voltage is applied to the gate electrode 8. In this case, such an action is caused that allows electrons injected from the source electrode 9 to pass through the n$^+$-type source area 4 and the channel area formed in the base area 3, and then to reach the n$^-$-type drift layer 2, thereby producing a current flow between the source electrode 9 and the drain electrode 10.

A method for manufacturing the SiC semiconductor device configured as illustrated in FIG. 1 according to the present embodiment is now described with reference to FIGS. 3A to 3F and FIG. 4.

Figure 3A:
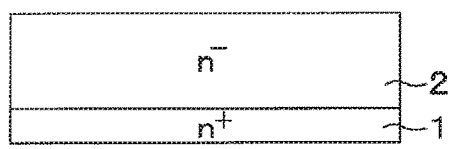
FIGS. 3A to 3F are cross-sectional views each illustrating a manufacturing step of the SiC semiconductor device shown in FIG. 1.

[Step Shown in FIG. 3A]

A semiconductor substrate is initially prepared. This semiconductor substrate is an epitaxial substrate that includes the n$^+$-type substrate 1 containing SiC, and the n$^-$-type drift layer 2 containing SiC and formed by epitaxial growth on the front face of the n$^+$-type substrate 1.

Figure 3D:
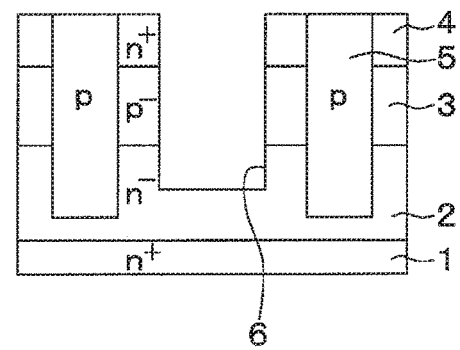
Figure 3B:
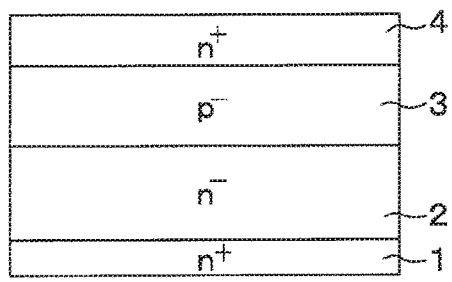

[Step Shown in FIG. 3B]

Figure 4:
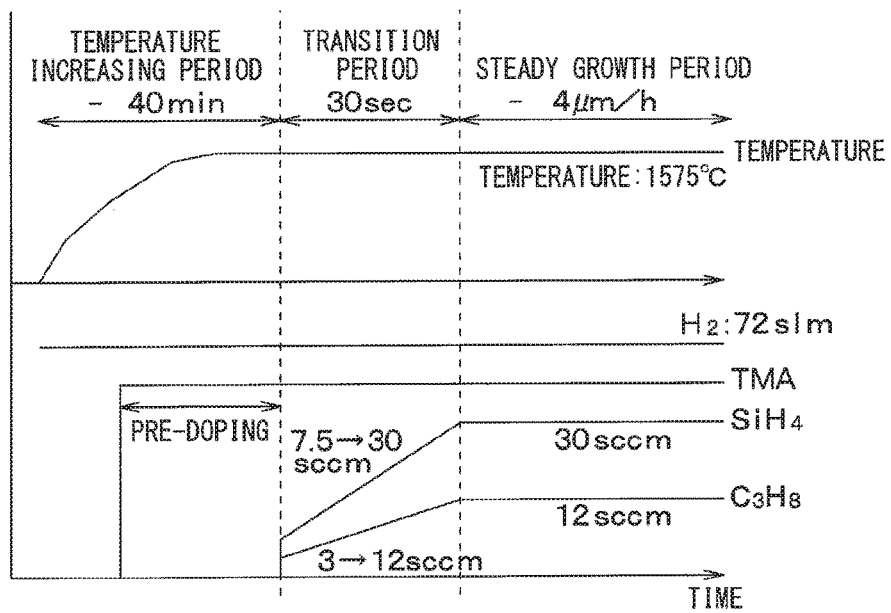
FIG. 4 is a time chart showing a profile of temperatures and gas introduction in a step for forming the base area.

A step for forming the base area 3 on the front face of the n$^-$-type drift layer 2, and a step for further forming the n$^+$-type source area 4 on the front face of the base area 3 are sequentially performed by using an epitaxial growth device (not shown). More specifically, as shown in FIG. 4, a dopant gas containing p-type impurities is initially introduced together with an SiC material gas after an elapse of a temperature increasing period for increasing a temperature inside the epitaxial growth device to a predetermined temperature, such as 1575° C. For example, the temperature increasing period is set to 40 minutes or shorter. The temperature is increased to the predetermined temperature within the set period.

For example, silane constituting an Si material and propane constituting a C material are employed as the SiC material gas. TMA containing p-type impurities is employed as the dopant gas for forming the base area 3.

Before a start of epitaxial growth, i.e., before introduction of the material gas, pre-doping for introducing the dopant gas is performed, thereafter the SiC material gas containing propane and silane is introduced into a chamber to cause epitaxial growth of the base area 3. This pre-doping performed before epitaxial growth produces an atmosphere filled with the dopant gas inside the chamber of the epitaxial growth device, and achieves absorption, or fixation, of the dopant to an inner wall surface of the chamber.

The present inventors have carried out extensive studies, and have confirmed that a sharp change of the impurity concentration of the base area 3 is difficult to achieve in an initial stage of epitaxial growth of the base area 3 when the SiC material gas and the dopant gas are simultaneously introduced. More specifically, the p-type dopant, which is an organic metal material, is absorbed by the inner wall surface of the chamber or other positions in the initial stage of gas introduction. In this case, an SiC-material gas rich atmosphere is produced by introduction of the dopant gas simultaneously with the growth gas during epitaxial growth. As a result, the p-type dopant concentration decreases in the atmosphere inside the chamber, wherefore the impurity concentration of the base area 3 becomes lower than a concentration expected in view of the introduction quantity of the dopant gas. This condition is called a rise delay that is peculiar to organic metal materials, and causes a slow change of the impurity concentration of the base area 3 in the growth direction, rather than a sharp change.

However, when pre-doping is performed before a start of epitaxial growth as in the manner of the present embodiment, dopant is absorbed by the inner wall surface of the chamber or other positions beforehand. In this case, absorption of the dopant is reduced during epitaxial growth. In addition, the absorption quantity into the chamber is controllable by controlling the pre-doping time. In this case, the impurity concentration profile of the p-type impurity layer is controllable. Accordingly, the p-type dopant concentration in the atmosphere inside the chamber is maintained at a desired concentration from the initial stage of epitaxial growth. In this condition, a sharp change of the impurity concentration of the base area 3 is achievable. In other words, as shown in an impurity concentration distribution shown in FIG. 2, the impurity concentration of the base area 3 is allowed to increase to a desired concentration from the initial stage of growth.

Moreover, the introduction quantity of the SiC material gas is gradually changed from a smaller quantity in the initial stage of introduction to a desired larger quantity. The introduction period of the SiC material gas is divided into a transition period in which the introduction quantity gradually increases, and a steady growth period that continues after the introduction quantity becomes constant. During the transition period, epitaxial growth slowly develops. During the steady growth period, epitaxial growth is achieved at a desired growth rate, such as 4 μm/h or smaller. For example, with the transition period set to 30 seconds, the introduction quantity of silane during the transition period is gradually increased from 3 sccm to 12 sccm, while the introduction quantity of propane during the transition period is gradually increased from 7.5 sccm to 30 sccm.

In this manner, deterioration of crystallinity of the base area 3 caused by rapid increase of the introduction quantity of the SiC material gas is avoidable during the transition period. After the growth develops to such an extent that crystallinity does not further deteriorate, epitaxial growth is allowed to develop at a desired rate.

Figure 5:
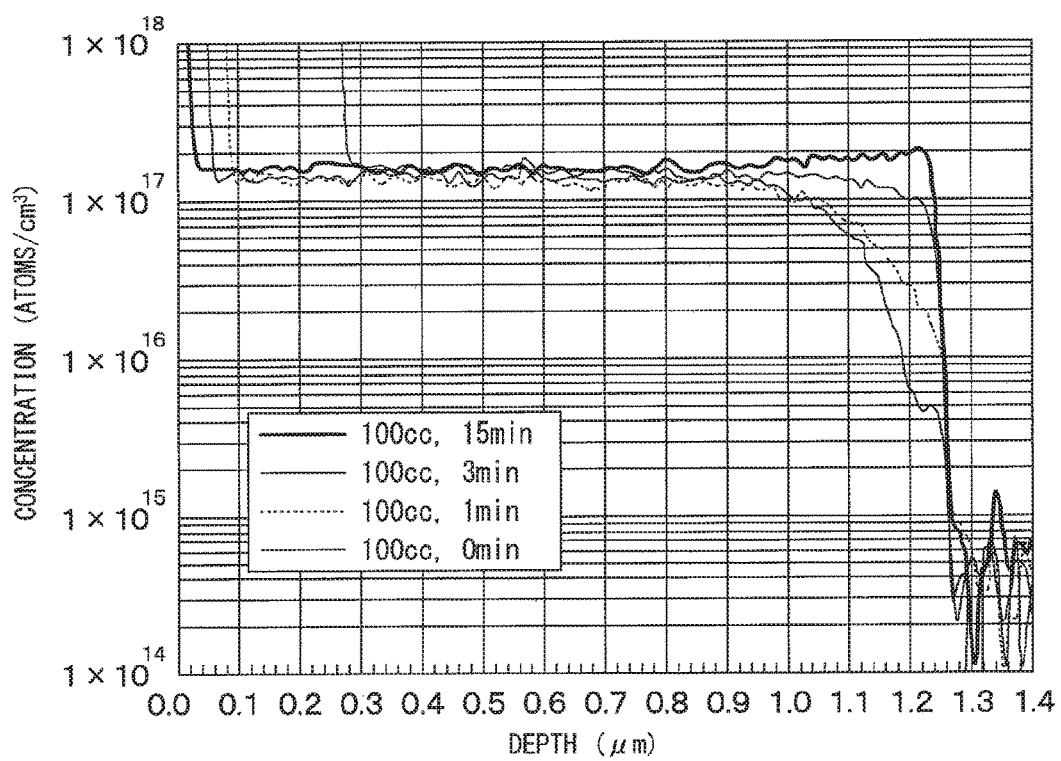
FIG. 5 is a graph showing a p-type impurity concentration profile in the base area with changes of a pre-doping time.

The pre-doping time for performing pre-doping in this manner may be set to any length of time. A sharper change of the impurity concentration of the base area 3 is achievable as the pre-doping time becomes longer. For example, as obvious from FIG. 5, an inclination of the p-type impurity concentration of the base area 3 increases as the pre-doping time becomes longer, in comparison with an inclination of the p-type impurity concentration of the base area 3 when the pre-doping time is 0 minutes, i.e., without pre-doping.

More specifically, an inclination of the p-type impurity concentration at the pre-doping time of 3 minutes is larger than an inclination of the p-type impurity concentration at the pre-doping time of 1 minute. An inclination at the pre-doping time of 15 minutes is still larger. FIG. 2 referred to above shows a change of the p-type impurity concentration at the pre-doping time of 15 minutes, i.e., an ideal concentration distribution where the impurity concentration of the base area 3 becomes substantially constant from the boundary position between the base area 3 and the n⁻-type drift layer 2. Accordingly, a change of the p-type impurity concentration of the base area 3 is achievable with excellent controllability by controlling the pre-doping time.

Subsequently, the dopant gas introduced into the epitaxial growth device is changed to further form the n⁺-type source area 4. The dopant gas employed in this step is nitrogen (N₂) constituting n-type impurities. In this manner, a step for forming the n⁺-type source area 4 on the front face of the base area 3 is performed.

Figure 3E:
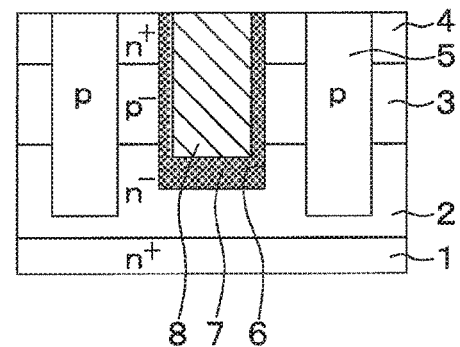
Figure 3C:
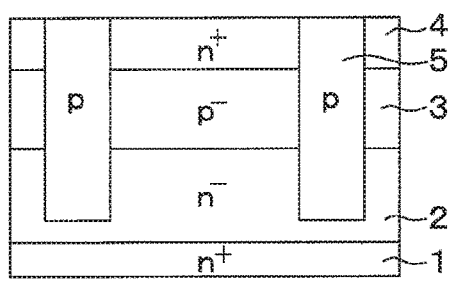

[Step Shown in FIG. 3C]

A mask member (not shown) is disposed on the front face of the n⁺-type source area 4. Subsequently, a predetermined position for forming the p-type deep layer 5 in the mask member is opened by photolithography. With the mask member disposed in this condition, anisotropic etching such as reactive ion etching (RIE) is performed to form a trench at the predetermined position for forming the p-type deep layer 5. Thereafter, the mask member is removed, and a p-type SiC layer is formed throughout the front face of the n⁺-type source area 4 including the inside of the trench by again using the epitaxial growth device. A SiC material gas and a dopant gas employed in this step are similar to those gases employed in the step for forming the base area 3. The gas introduction quantity is controlled in accordance with the impurity concentration of the p-type deep layer 5.

Subsequently, the front face of the n⁺-type source area 4 is exposed by planarization such as grinding and chemical mechanical polishing (CMP). In this manner, the p-type SiC layer remaining only inside the trench constitutes the p-type deep layer 5.

[Step Shown in FIG. 3D]

A mask member (not shown) is disposed on the front faces of the n⁺-type source area 4 and the p-type deep layer 5. Subsequently, a predetermined position for forming the trench 6 in the mask member is opened by photolithography. With the mask member disposed in this condition, anisotropic etching such as RIE is performed to form the trench 6 in the cell area. Thereafter, the mask member is removed.

Hydrogen etching is carried out as necessary by heating in a hydrogen atmosphere at 1600° C. or higher and under depressurization, such as a high-temperature hydrogen atmosphere at 1625° C. and $2.7 \times 10^4$ Pa (=200 Torr). This hydrogen etching achieves rounding of the inner wall surface of the trench 6, i.e., rounding an open inlet or a corner portion of the trench 6, and removing damage caused by trench etching.

Figure 3F:
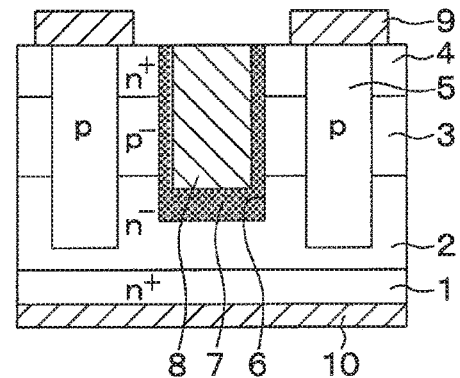

[Step Shown in FIGS. 3E and 3F]

The gate insulation film 7 is formed by thermal oxidation in a wet atmosphere. Thereafter, a doped Poly-Si layer is formed on the front face of the gate insulation film 7, and is patterned such that the doped Poly-Si layer remains inside the trench 6 and constitutes the gate electrode 8. Steps after the foregoing steps are similar to steps conventionally performed. More specifically, a step for forming interlayer insulation films, a step for forming contact holes by photo-etching, a step for forming the source electrode 9 and the gate wiring layer by patterning after deposition of electrode material, a step for forming the drain electrode 10 on the rear face of the n⁺-type substrate 1, and other steps are performed. As a result, the SiC semiconductor device that includes the vertical MOSFET having the trench gate structure in FIG. 1 and provided in the cell area is completed.

As described above, according to the SiC semiconductor device that includes the vertical MOSFET having the inverted type trench gate structure presented in the present embodiment, pre-doping of a dopant gas is performed before epitaxial growth of the base area 3. Pre-doping thus performed achieves absorption of the dopant by the inner wall surface of the chamber or other positions beforehand, and reduces absorption of the dopant during epitaxial growth. In addition, the absorption quantity inside the chamber is controllable by controlling the pre-doping time. In this case, the impurity concentration profile of the p-type impurity layer is controllable. Accordingly, the p-type dopant concentration in the atmosphere inside the chamber, for example, is maintained at a desired concentration from the initial stage of epitaxial growth. In this condition, a sharp change of the impurity concentration of the base area 3 is achievable.

Second Embodiment

A second embodiment is now described. The present embodiment is similar to the first embodiment except for the configuration and manufacturing process of the base area 3 that have been changed from the corresponding configuration and process of the first embodiment. Accordingly, only parts different from the corresponding parts of the first embodiment are herein described.

Figure 6:
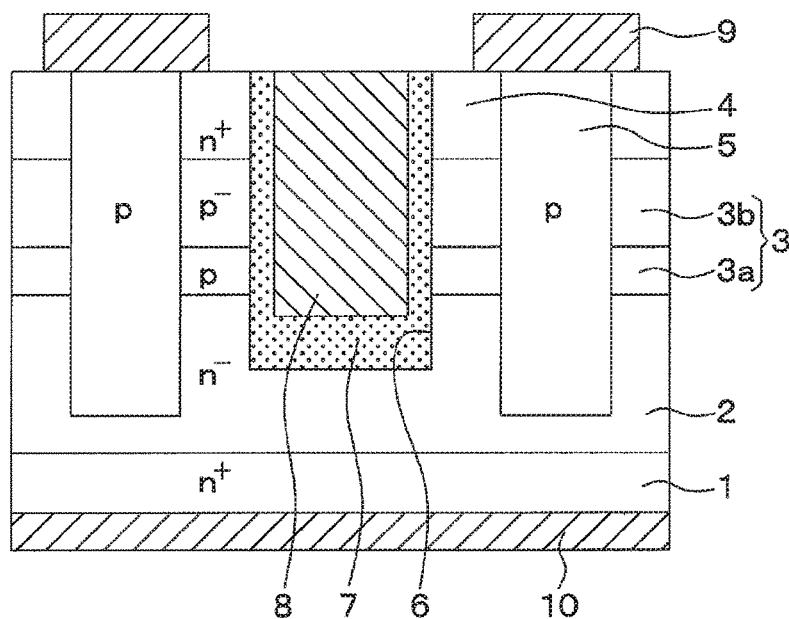
FIG. 6 is a diagram illustrating a cross-sectional configuration of an SiC semiconductor device according to a second embodiment.

As illustrated in FIG. 6, the base area 3 according to the present embodiment has a structure constituted by a sequentially lamination of a high-concentration base area 3a that has a relatively high p-type impurity concentration, and a low-concentration base area 3b that has a p-type impurity concentration lower than the p-type impurity concentration of the high-concentration base area 3a.

Figure 7:
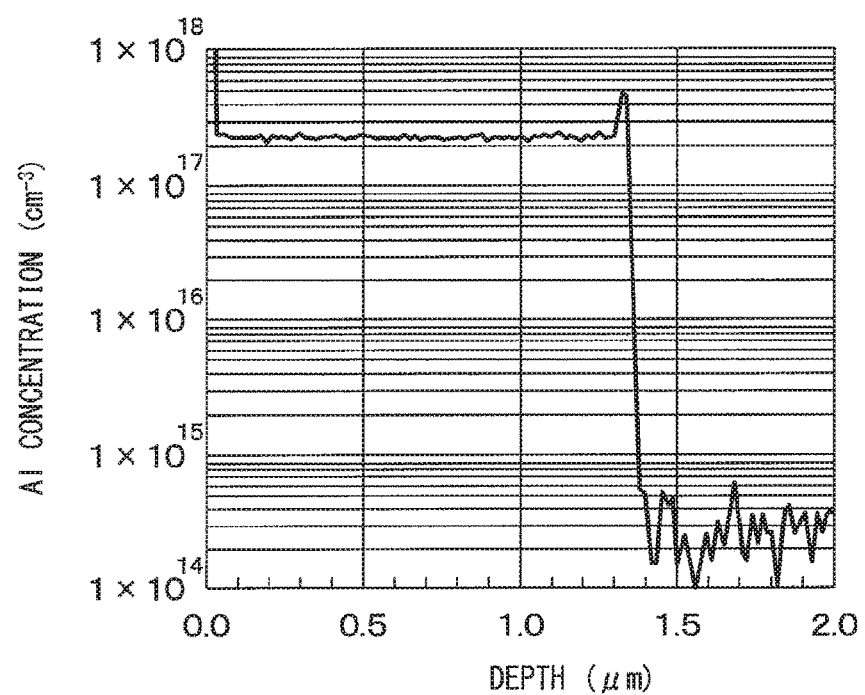
FIG. 7 is a graph showing a p-type impurity concentration profile in a base area.

For example, the high-concentration base area 3a has a p-type impurity concentration of $5 \times 10^{17}$/cm³ or higher, such as $1 \times 10^{18}$/cm³, and has a thickness of 50 nm (nanometers). For example, the low-concentration base area 3b has a p-type impurity concentration of $3.0 \times 10^{17}$/cm³ or lower, and has a thickness of 250 nm. For example, the base area 3 is configured to have a concentration profile of Al (aluminum) constituting p-type impurities as shown in FIG. 7. More specifically, as shown in FIG. 7, the low-concentration base area 3b is configured to have a p-type impurity concentration of approximately $2.5 \times 10^{17}$/cm³ from the front face of the base area 3 up to a depth of approximately 1.3 μm. The dope quantity of p-type impurities is increased in a pulsed manner in a portion located at a depth approximately in a range from 1.3 μm to 1.4 μm from the front face of the base area 3 to form the high-concentration base area 3a having a p-type impurity concentration of approximately $5 \times 10^{17}$/cm³.

When the base area 3 is constituted by the high-concentration base area 3a and the low-concentration base area 3b as in this manner, a channel is formed by the high-concentration base area 3a and the low-concentration base area 3b. Accordingly, following advantageous effects are offered.

The high-concentration base area 3a provided therein reduces expansion of a depletion layer inside the base area 3. In this case, full depletion inside the base area 3 and punch-through caused thereby are avoidable. Accordingly, a sufficient element breakdown voltage is securable, while deterioration of the gate insulation film 7 at the bottom portion of the trench 6 is avoidable. Moreover, a threshold voltage becomes dependent on the p-type impurity concentration of the high-concentration base area 3a. Accordingly, a threshold voltage is allowed to increase.

The base area 3 includes not only the high-concentration base area 3a, but also the low-concentration base area 3b. In this case, channel mobility is allowed to increase in the low-concentration base area 3b. Accordingly, even in the presence of the high-concentration base area 3a, reduction of on-resistance is achievable. The vertical MOSFET having the trench gate structure provided therein is therefore capable of reducing on-resistance, securing a sufficient element breakdown voltage, and increasing a threshold voltage.

The high-concentration base area 3a provided therein improves the pull-out effect of carriers produced by junction between the n⁻-type drift layer 2 and the base area 3 in an off-state. In this case, a drain leak current decreases. More specifically, the pull-out effect of the carriers at the junction portion of the base area 3 being in contact with the n⁻-type drift layer 2 more improves as the p-type impurity concentration at the junction portion increases. According to the present embodiment, this junction portion corresponds to the high-concentration base area 3a. In this case, the pull-out effect of the carriers produced by junction between the n⁻-type drift layer 2 and the base area 3 improves more than a configuration that constitutes the base area 3 only by the low-concentration base area 3b. The high-concentration base area 3a is formed throughout the lower layer part of the base area 3. In this case, a state of contact between the base area 3 and the n⁻-type drift layer 2 extends in a wider range, and connects to the p-type deep layer 5. Accordingly, drawing-out is achievable via the p-type deep layer 5. As a result, the pull-out effect of the carriers further improves.

The contact portion of the base area 3 being in contact with the n⁻-type drift layer 2 is constituted only by the high-concentration base area 3a having a high p-type impurity concentration. In this case, reduction of an initial voltage is achievable for a current flow in a built-in diode constituted by PN junction between the n⁻-type drift layer 2 and the base area 3. The reduction of the initial voltage thus achieved reduces on-voltage of the built-in diode, thereby reducing losses produced during synchronous rectification driving that positively uses the built-in diode.

Moreover, an equipotential line does not easily enter below the trench gate structure in the off state by the presence of a depletion layer extending from the high-concentration base area 3a toward the n⁻-type drift layer 2. In this case, an electric field applied to the gate insulation film 7 does not intensively concentrate on the bottom face of the trench 6. Accordingly, the life and reverse bias life of the gate insulation film 7 increase.

A method for manufacturing the SiC semiconductor device according to the present embodiment is now described with reference to FIGS. 8A to 8F and FIG. 9.

Figure 8A:
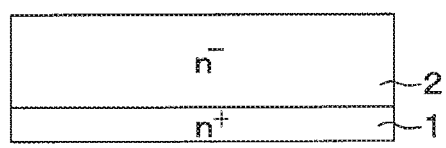
FIGS. 8A to 8F are cross-sectional views each illustrating a manufacturing step of the SiC semiconductor device shown in FIG. 6.
Figure 8D:
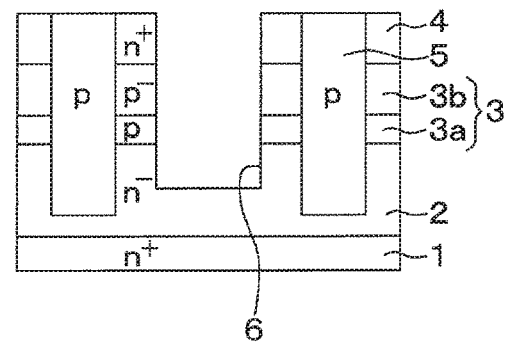
Figure 8B:
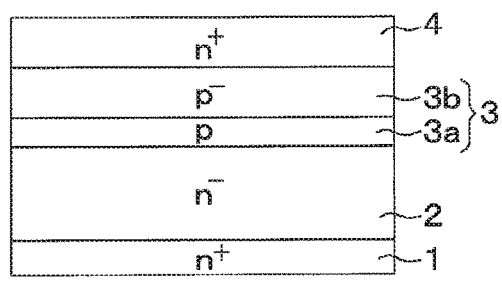
Figure 8E:
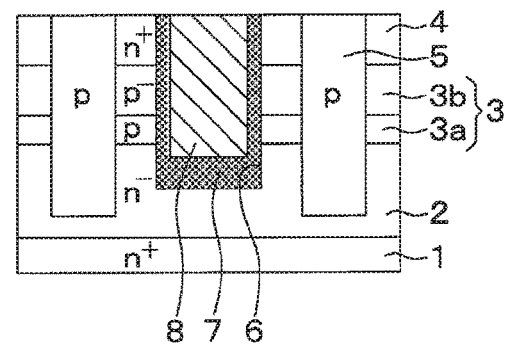
Figure 8C:
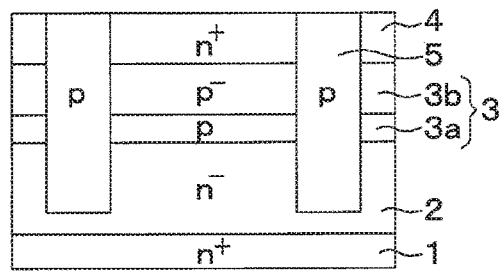
Figure 8F:
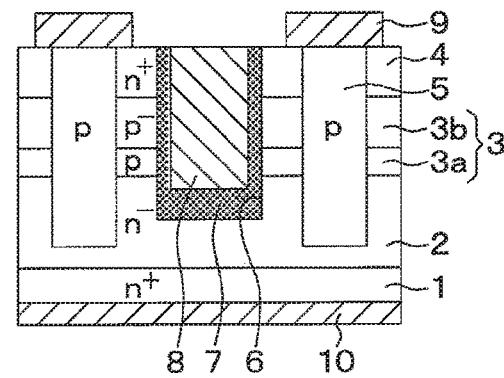
Figure 9:
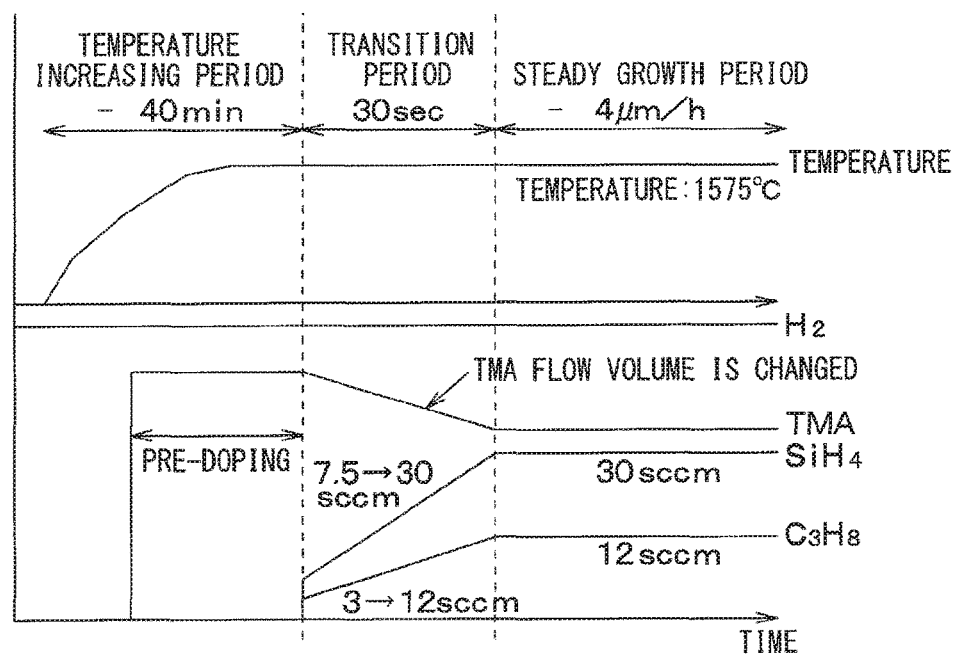
FIG. 9 is a time chart showing a profile of temperatures and gas introduction in a step for forming the base area.

A semiconductor substrate is initially prepared in a step illustrated in FIG. 8A. This semiconductor substrate includes the n⁻-type drift layer 2 formed on the front face of the n⁺-type substrate 1, similarly to the step illustrated in FIG. 3A. In a subsequent step illustrated in FIG. 8B, a step for forming the base area 3 on the n⁻-type drift layer 2 is performed. The base area 3 is constituted by the high-concentration base area 3a and the low-concentration base area 3b. A step for forming the n⁺-type source area 4 on the front face of the base area 3 is further performed.

More specifically, after an elapse of a temperature increasing period for increasing a temperature inside the epitaxial growth device and performing pre-doping, a dopant gas containing p-type impurities is introduced together with an SiC material gas during the transition period and the steady growth period. The temperature conditions for the temperature increasing period, the transition period, and the steady growth period, the type of the dopant gas to be introduced, and the type and introduction quantity of the SiC material gas are similar to the corresponding conditions and the like according to the first embodiment. However, the introduction quantity of the dopant gas is changed from that quantity of the first embodiment.

Initially, for forming the high-concentration base area 3a, the introduction quantity of TMA during the pre-doping period is increased to a value larger than the introduction quantity of TMA for the low-concentration base area 3b formed after the formation of the high-concentration base area 3a. Subsequently, the introduction quantity of TMA is gradually decreased during the transition period to reach an introduction quantity of TMA for the steady growth period at the end of the transition period. As a result, the p-type impurity concentration sharply increases relative to a growth quantity of the base area 3, and reaches a peak concentration of the high-concentration base area 3a as shown in FIG. 7. Thereafter, the p-type impurity concentration gradually decreases during the transition period or after an elapse of the transition period, and becomes constant at a concentration of the low-concentration base area 3b. The base area 3 including the high-concentration base area 3a and the low-concentration base area 3b is thus formed.

Subsequently, the dopant gas introduced into the epitaxial growth device is changed to further form the n⁺-type source area 4. The dopant gas employed in this step is nitrogen ($N_2$) constituting n-type impurities. In this manner, a step for forming the n⁺-type source area 4 on the front face of the base area 3 is performed.

Thereafter, a manufacturing method similar to the method according to the first embodiment are performed as illustrated in FIGS. 8C to 8F to manufacture the SiC semiconductor device according to the present embodiment.

As described above, according to the SiC semiconductor device that includes the vertical MOSFET having the inverted type trench gate structure presented in the present embodiment, the base area 3 is constituted by the high-concentration base area 3a and the low-concentration base area 3b. The vertical MOSFET having the trench gate structure provided therein is therefore capable of reducing on-resistance, securing a sufficient element breakdown voltage, and increasing a threshold voltage.

Other Embodiments

Although the present disclosure is described based on the above embodiments, the present disclosure is not limited to the embodiments. Various changes and modification may be made in the present disclosure. Furthermore, various combination and formation, and other combination and formation including one, more than one or less than one element may be made in the present disclosure.

For example, according to the second embodiment, the base area 3 is divided into the high-concentration base area 3a and the low-concentration base area 3b. According to this configuration, the impurity concentration may gradually change in the boundary portion between the high-concentration base area 3a and the low-concentration base area 3b. In this case, the high-concentration base area 3a and the low-concentration base area 3b having different p-type impurity concentrations may be laminated on each other with the boundary portion interposed between the high-concentration base area 3a and the low-concentration base area 3b. In a different mode, the low-concentration base area 3b may be constituted by an i-type semiconductor in a non-doped state, i.e., in a state containing substantially no p-type impurities for doping. For example, the dope quantity of the low-concentration base area 3b may be only a quantity sufficient for doping p-type impurities remaining in the atmosphere during epitaxial growth. In this case, channel mobility in the low-concentration base area 3b further increases, wherefore on-resistance further decreases.

According to the respective embodiments described herein by way of example, the n⁻-type drift layer 2 is formed on the front face of the n type substrate 1 to constitute a structure of a semiconductor substrate that includes a high impurity concentration rear face layer on the rear face side, and a drift layer disposed on the front face side and having an impurity concentration lower than the impurity concentration of the rear face layer. However, this structure is presented only by way of example of the semiconductor substrate. For example, the semiconductor substrate may include a rear face layer produced by ion implantation of n-type impurities or by epitaxial growth on a rear face side of a substrate constituted by the n⁻-type drift layer 2.

According to the n-channel type vertical MOSFET in the respective embodiments described herein by way of example, n-type is designated as a first conductive type, while p-type is designated as a second conductive type. However, the present disclosure is applicable to a p-channel type vertical MOSFET that includes constituent elements whose conductive types are inverted.

According to the respective embodiments described herein by way of example, SiC is adopted as the compound semiconductor. The base area 3 constituting a p-type impurity layer is formed on the n⁻-type drift layer 2 constituting a foundation layer as an example of epitaxial growth of the p-type impurity layer. This configuration is described only by way of example. The present disclosure is applicable to epitaxial growth of a p-type impurity layer containing a compound semiconductor and formed on a foundation layer containing a compound semiconductor, or is applicable to crystal growth that employs organic metal for dopant or material gas.

The invention claimed is:

1. A method for manufacturing a compound semiconductor device, the method comprising
causing epitaxial growth of a p-type impurity layer containing a compound semiconductor on a foundation layer containing the compound semiconductor, wherein
the causing the epitaxial growth includes performing pre-doping to preliminarily introduce dopant gas before introducing material gas for the epitaxial growth of the compound semiconductor,
the dopant gas contains an organic metal material providing dopant of p-type impurities, and
an impurity concentration profile of the p-type impurity layer is controlled by controlling a time of the pre-doping.

2. The method for manufacturing the compound semiconductor device according to claim 1, wherein
in the causing the epitaxial growth, the pre-doping is performed to maximize an impurity concentration of the p-type impurity layer in an initial stage of the epitaxial growth.

3. The method for manufacturing the compound semiconductor device according to claim 2, wherein
in the causing the epitaxial growth, an introduction quantity of the dopant gas in the pre-doping is increased than an introduction quantity of the dopant gas after the introducing of the material gas to maximize the impurity concentration of the p-type impurity layer in the initial stage of the epitaxial growth.

4. The method for manufacturing the compound semiconductor device according to claim 1, wherein
the compound semiconductor includes silicon carbide,
the method further comprises:
providing a semiconductor substrate that is formed of first conductive type silicon carbide and includes a rear face layer and a drift layer, the rear face layer having a high impurity concentration and disposed on a rear face side of the semiconductor substrate, the drift layer having an impurity concentration lower than the rear face layer, disposed on a front face side of the semiconductor substrate, and providing the foundation layer;
forming a base area on the drift layer, the base area containing silicon carbide;
forming a source area above the base area, the source area containing first conductive type silicon carbide having an impurity concentration higher than the drift layer;
forming a trench that extends from a front face of the source area to a position deeper than the base area;
forming a trench gate structure by forming a gate insulation film on an inner wall surface of the trench, and forming a gate electrode on the gate insulation film;
forming a source electrode that is electrically connected to the source area; and
forming a drain electrode that is electrically connected to the rear face layer disposed on the rear face side of the semiconductor substrate, and
the forming the base area includes the causing the epitaxial growth.

* * * * *